(12) United States Patent
Jiang et al.

(10) Patent No.: US 6,545,313 B1
(45) Date of Patent: Apr. 8, 2003

(54) EEPROM TUNNEL WINDOW FOR PROGRAM INJECTION VIA P+ CONTACTED INVERSION

(75) Inventors: Chun Jiang, San Jose, CA (US); Robert Tu, Sunnyvale, CA (US); Sunil D. Mehta, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 10/211,125

(22) Filed: Aug. 2, 2002

Related U.S. Application Data

(62) Division of application No. 09/870,541, filed on Jun. 1, 2001, now Pat. No. 6,455,375.

(51) Int. Cl.$^7$ .............................................. H01L 29/788
(52) U.S. Cl. ........................................ 257/321; 438/264
(58) Field of Search ........................... 257/314–321; 365/103, 159, 171, 185, 185.1, 185.2, 200, 226; 438/149, 201, 211, 257–267, 270, 286

(56) References Cited

U.S. PATENT DOCUMENTS 5,761,116 A * 6/1998 Li et al. ................... 365/185.1
5,885,877 A * 3/1999 Gardner et al. ............. 438/300

* cited by examiner

Primary Examiner—Kamand Cuneo
Assistant Examiner—Asok Kumar Sarkar

(57) ABSTRACT

An improved method for fabricating a tunnel oxide window for use in an EEPROM memory cell is provided so as to produce better programming endurance. A P+ implant is provided at the tunnel window edge. During the programming operation, the P+ contacted inversion layer is used instead of the program junction. As a result, there is eliminated the voltage drop in the program junction region so as to improve the efficiency of programming.

12 Claims, 2 Drawing Sheets

EEPROM TUNNEL WINDOW FOR PROGRAM INJECTION VIA P+ CONTACTED INVERSION

This is a divisional of an earlier filed copending patent application, with Ser. No. 09/870,541 filed on Jun. 1, 2001, U.S. Pat. No. 6,455,375, for which priority is claimed. This earlier filed copending patent application with Ser. No. 09/870,541 is in its entirety incorporated herewith by reference.

BACKGROUND OF THE INVENTION

This invention relates generally to electrically erasable programmable read-only memory (EEPROM) devices. More particularly, it relates to an EEPROM cell having an improved tunnel window which permits programming via a P+ contacted inversion layer so as to produce better programming endurance.

As is generally well-known in the art, electrically erasable programmable read-only memory devices can be both erased and programmed electrically without the necessity of exposure to ultraviolet light. Typically, an EEPROM memory cell is formed of three transistors consisting of a write or program transistor, a read transistor, and a sense transistor. Such a conventional EEPROM memory cell 10 is illustrated schematically in FIG. 1 and includes a write transistor 12 and an inverter. The inverter is formed of an NMOS read transistor 16 and a floating gate PMOS read transistor 14. The PMOS read transistor 14 and the NMOS read transistor 16 are connected so as to function as a sense inverter which creates a so-called "zero-power cell". The read transistor 14 has its source connected to a VD line 18 and its drain connected to the drain of the read transistor 16. The read transistor 14 has its floating gate FG capacitively coupled via a tunneling oxide diode D to the source of the write transistor 12. The substrate of the tunnel diode D is a highly-doped active area which is referred to as a program junction. The floating gate FG is also capacitively coupled to Control Gate line CG via a gate capacitor C. The write transistor 12 has its drain connected to a word bitline WBL and its gate connected to a word line WL. The read transistor 16 has its gate connected to the gate of the read transistor 14 and its source connected to a VS line 20.

The various voltages applied to the EEPROM memory cell 10 of FIG. 1 for programming and erasing operations, respectively, are listed in the Table below:

TABLE

|  | WBL | CG | WL | VD | VS |
| --- | --- | --- | --- | --- | --- |
| Program | Vpp | 0 | Vpp+ | 0 | 0 |
| Erase | 0 | Vpp+ | Vdd | Vdd | Vdd |

In order to program the EEPROM memory cell, an intermediate voltage Vpp (typically 11 V–12 V) is applied to the bitline WBL of the write transistor 12 and a relatively high voltage Vpp+ (typically 13 V–15V) is applied to the word line WL so as to pass the voltage Vpp to the source of the write transistor 12. It will be noted that the Control Gate line CG, VD line 18, and VS line 20 are all grounded. Under this bias condition, hot electrons are accelerated across the tunneling diode D from floating gate FG to source of the write transistor 12, creating a voltage drop therebetween. Since the electrons are tunneling from the floating gate FG, this results in the storing of a positive charge on the floating gate of the read transistor 14.

In order to erase the EEPROM memory cell, a relatively high voltage Vpp+ (typically +13 V–15 V) is applied to the Control Gate line CG and a small positive voltage Vbb (i.e., +5 V) is applied to the word line WL, the VD line 18, and the VS line 20. The bitline WBL of the write transistor 12 is grounded. Under this bias condition, electrons are drawn back through the tunneling diode D from the source of the write transistor and onto the floating gate FG, creating a voltage drop therebetween. Since the electrons are tunneling to the floating gate, this results in the storing of a negative charge on the floating gate of the read transistor 14.

As is also known in the art, the key to the programming and erasing operations for Fowler-Norheim current injection is the tunneling oxide diode D. More specifically, the important element is the portion of the tunnel oxide through which the electrons flow which is sometimes referred to as a tunneling window. During the programming process for the conventional EEPROM memory cell, the high electric fields across the tunneling oxide will cause a gate negative Fowler-Norheim current to flow so as to create a voltage drop in the depletion region of the program junction. As a consequence, there will be created charge trapping centers and band bending at the polysilicon edge which in turn degrades the programming performance.

In view of this, it would still be desirable to provide a method for fabricating a tunnel oxide window for use in an EEPROM process which eliminates the problem of a voltage drop during programming. This is achieved in the present invention by the provision of a P+ implant at the tunnel window edge which allows programming of the EEPROM memory cell through a P+ contacted inversion layer instead of the programming junction.

SUMMARY OF THE INVENTION

In accordance with a preferred embodiment of the present invention, there is provided a method for fabricating a tunnel oxide window for use in an EEPROM memory device. A PRJ region is implanted in a semiconductor substrate. A tunnel oxide layer is formed on the top surface of the PRJ region. A floating gate electrode is then formed over the tunnel oxide on the top surface of the PRJ region. A first type of impurity ions is implanted into the PRJ region on a first side of the floating gate electrode with the gate electrode acting as a mask so as to form an N-type lightly-doped drain region. A second type of impurity ions is implanted into the PRJ region on a second side of the gate electrode with the gate electrode acting as a mask so as to form a P-type lightly-doped drain region.

First and second sidewall spacers are formed on the respective first and second sides of the gate electrode. The first type of impurity ions is implanted into the PRJ region on the first side of the gate electrode with the gate electrode and the first sidewall spacer acting as a mask so as to form a highly-doped N+ diffusion region. The second type of impurity ions is implanted into the PRJ region on the second side of the gate electrode with the gate electrode and the second sidewall spacer acting as a mask so as to form a highly-doped P+ contacted inversion layer.

In another aspect of the present invention, there is provided an EEPROM memory cell which includes a PRJ region implanted in a semiconductor substrate and a tunnel oxide layer implanted on the top surface of the PRJ region. A floating gate electrode is formed over the tunnel oxide on the top surface of the PRJ region. A first type of impurity ions is implanted into the PRJ region on a first side of the gate electrode with the gate electrode acting as a mask so as to form an N-type lightly-doped drain region. A second type of impurity ions is implanted into the PRJ region on a second side of the gate electrode with the gate electrode acting as a mask so as to form a P-type lightly-doped drain region.

First and second sidewall spacers are formed on the respective first and second sides of the gate electrode. The first type of impurity ions is implanted into the PRJ region on the first side of the gate electrode with the gate electrode and the first sidewall spacer acting as a mask so as to form a highly-doped N+ diffusion region. The second type of impurity ions into the PRJ region on the second side of the gate electrode with the gate electrode and the second sidewall spacer acting as a mask so as to form a highly-doped P+ contacted inversion layer.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
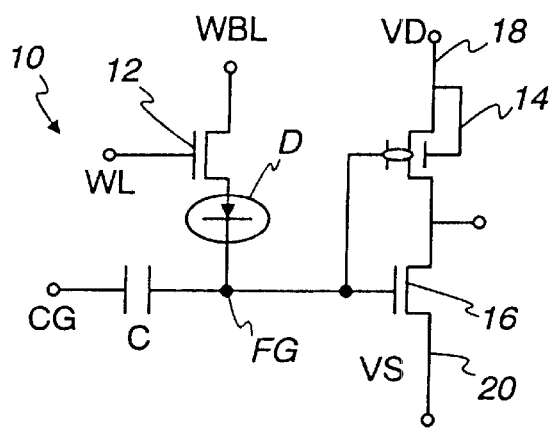
FIG. 1 is a schematic circuit diagram of a conventional EEPROM memory cell.

Before describing in detail the method for fabricating a tunnel oxide window of the present invention, it is believed that it would be helpful in understanding the principles of the instant invention and to serve as a background by explaining initially how a conventional tunneling oxide window design for forming the tunnel oxide diode D of FIG. 1 is obtained. Therefore, the conventional fabrication process employed for forming the EEPROM tunneling oxide window will now be described below as well as the problems associated therewith.

Figure 2:
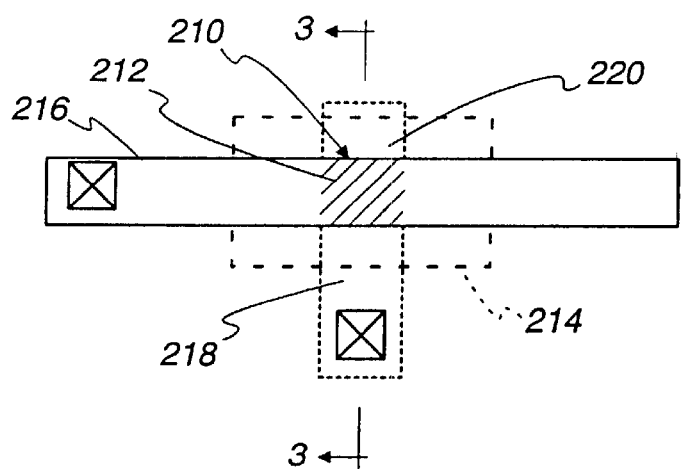
FIG. 2 is a top plan view of a prior art tunneling oxide window design for forming the tunnel oxide diode D of FIG. 1.

In FIG. 2, there is shown a top plan view of a conventional EEPROM tunneling oxide window design for forming the tunnel oxide diode D of FIG. 1 which is used for Fowler-Norheim current injection during programming and erasing operations. As can be seen, a tunneling window 210 is formed by a tunnel/gate oxide 212 formed over an active region defined by a program junction 214 and underneath a polysilicon floating gate 216. N+ diffusion regions 218, 220 are implanted on opposite sides of the floating gate 216. During the erasing process, Fowler-Norheim tunneling current is passed through the N+ diffusion regions 218, 220 and the program junction (PRJ) region 214 so as to create a gate positive Fowler-Norheim current. This results in a voltage drop in the N+ region 218 of the PRJ region 214. Similarly, during the programming process, Fowler-Norheim tunneling current is passed through the N+ regions 218, 220 and the PRJ region 214 so as to create a gate negative Fowler-Norheim current. This results also in a voltage drop in the N+ region 220 of the PRJ region 214.

Figure 3:
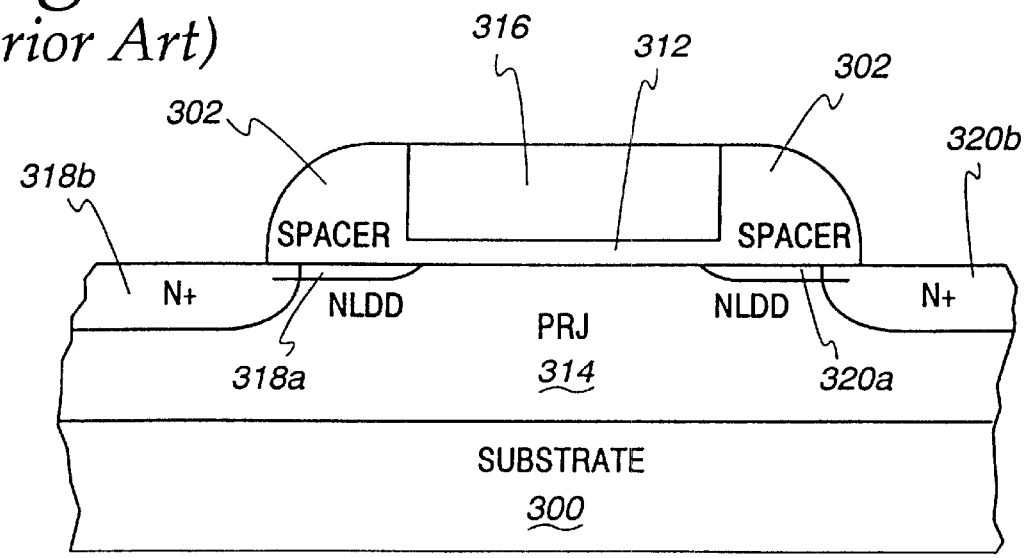
FIG. 3 is a cross-sectional view of the tunnel oxide window of FIG. 2, taken along the lines 3—3.

In FIG. 3, there is illustrated a cross-sectional view of the tunnel window design of FIG. 2, taken along the lines 3—3. A program junction (PRJ) implant is performed so as to form a PRJ region 314 in the surface of a silicon substrate 300. The PRJ region 314 is formed using a N-type impurity which may be phosphorus ions or arsenic ions. Then, a high voltage gate oxidation step is used to grow a HV gate oxide layer to a thickness of approximately 110Å. This is performed by thermal oxidation in a dry oxide atmosphere at about 900° C. Thereafter, a rapid-thermal anneal (RTA) process is performed on the PRJ implant at 800–1000° C. for about 15 minutes. Next, a tunnel etch is used to remove the HV gate oxide from the surface of the PRJ region 314.

After the tunnel etch, a low voltage gate oxidation step is performed so as to grow a tunnel oxide/LV gate oxide layer 312 having a thickness of about 80 Å or less. Then, a polysilicon layer is deposited, patterned and etched so as to form the polysilicon floating gate 316. Using the gate electrode 316 as a mask, N-type lightly-doped drain (NLDD) regions 318a, 320a corresponding to respective certain portions of the N+ diffusion regions 218, 220 of FIG. 2 are formed by implanting phosphorus ions or arsenic ions.

Thereafter, a silicon dioxide film is deposited and an etchback is carried out so that sidewall spacers 302 are formed on each side of the gate electrode 316. Next, using the gate electrode 316 and the sidewall spacers 302 as a mask highly-doped N+ regions 318b, 328b corresponding to respective other portions of the N+ diffusion regions 218, 220 of FIG. 2 are formed by implanting phosphorus ions or arsenic ions.

However, in the above-described conventional EEPROM tunnel window design of FIGS. 2 and 3, the voltage drops in the N+ diffusion regions 218, 220 during the programming and erasing operations will decrease its programming efficiency. This, in turn, will cause band bending at the edge of the polysilicon gate 316 so as to reduce its programming endurance.

In order to eliminate the problem of the voltage drop during programming, the inventors have proposed to add a P-type implant at the tunnel window edge. In this manner, the P-type implant is used during the programming process which permits the Fowler-Norheim current to pass therethrough instead of through the PRJ region 314, thereby avoiding the creation of a voltage drop. As a consequence, the endurance performance will be improved by elimination of the band bending at the polysilicon edge.

Figure 4:
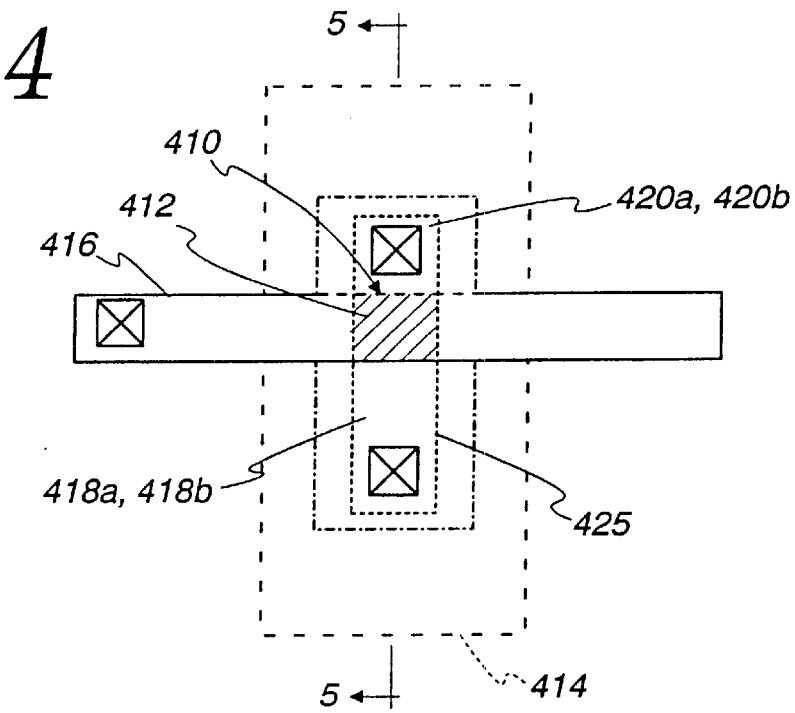
FIG. 4 is a top plan view of a tunnel oxide window design for forming the tunnel oxide diode D of FIG. 1, embodying the principles of the present invention.

The method for fabricating the tunnel oxide window design of the present invention so as to eliminate a voltage drop during programming operations will now be described with reference to FIGS. 4 and 5. As can be seen from FIG. 4, there is illustrated a top plan view, similar to FIG. 2, of an improved EEPROM tunnel oxide window design for forming the tunnel oxide diode D of FIG. 1 so as to eliminate the voltage drop during programming. The only differences between FIG. 4 and FIG. 2 are that the N-type lightly-doped drain region 320a and the N+ diffusion region 320b have been replaced with a P-type lightly-doped drain (PLDD) region 420a and a P+ contacted inversion layer 420b, respectively. The P+ layer 420b is connected to the N+ diffusion region 418b by a wiring layer 425. For the programming process, the Fowler-Norheim current is passed through the P+ layer 420b, thereby eliminating the voltage drop in the PRJ region 414. In particular, a tunnel window 410 is formed by a tunnel oxide/gate oxide 412 grown over an active region defined by a program junction 414 and underneath a polysilicon floating gate 416. N+ diffusion regions 418a,418b are implanted on a first side of the floating gate 416. P+ diffusion regions 420a, 420b are implanted on a second side of the floating gate 416.

Figure 5:
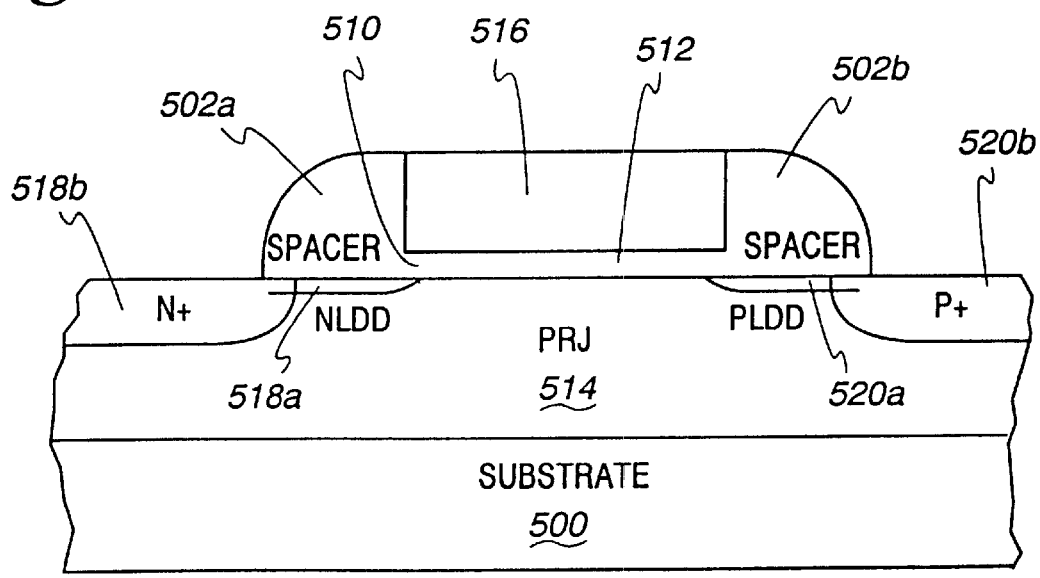
FIG. 5 is a cross-sectional view of the tunnel oxide window of FIG. 4, taken along the lines 5—5.

In FIG. 5, there is illustrated a cross-sectional view of the tunnel window design of FIG. 4, taken along the lines 5—5. A program junction (PRJ) implant is performed so as to form a PRJ region 514 in the surface of a silicon substrate 500. Then, a high voltage gate oxidation step is used to grow a HV gate oxide layer to a thickness of about 110 Å. This is performed by thermal oxidation in a dry oxide atmosphere at approximately 900° C. Thereafter, a rapid-thermal anneal (RTA) process is performed on PRJ implant at 800–1000° C. for about 15 minutes. Next, a tunnel etch is used to remove the HV gate oxide from the surface of the PRJ region 514.

After the tunnel etch, a low voltage gate oxidation step is performed so as to grow a tunnel oxide/LV gate oxide layer 512 having a thickness of approximately 80 Å or less. Then, a polysilicon layer is deposited, patterned, and etched so as to form the polysilicon floating gate electrode 516. A tunnel window 510 corresponding to the tunnel window 410 of FIG. 4 is defined by the intersection of the tunnel oxide layer 512 and the gate electrode 516. Using the gate 516 as a mask, an N-type lightly-doped drain (NLDD) region 518a corresponding to the N+ diffusion region 418a of FIG. 4 is formed by implanting phosphorus ions or arsenic ions. Using the gate 516 as a mask again, a low voltage P-type lightly-doped drain (PLDD) region 520a corresponding to the P+ diffusion region 420a of FIG. 4 is formed by implanting boron ions or $BF_2$ ions. The dose is preferably $5 \times 10^{13}$ ions/cm$^2$ and the energy is preferably at 35 KeV.

Thereafter, a silicon dioxide film is deposited and an etchback is carried out so that sidewall spacers 502a, 502b are formed on each side of the gate electrode 516. Next, using the gate 516 and the sidewall spacer 502a as a mask, a highly-doped N+ region 518b corresponding to the N+ diffusion region 418b of FIG. 4 is formed by implanting again phosphorus ions or arsenic ions. Finally, a high-doped P+ region 520b functioning as a P+ contacted inversion layer and corresponding to the P+ diffusion region 420b of FIG. 4 is formed by implanting again boron ions or $BF_2$ ions. The dose is preferably about $2 \times 10^{15}$ ions/cm$^2$ and the energy is preferably at 40 KeV.

From the foregoing detailed description, it can thus be seen that the present invention provides an improved method for fabricating a tunnel oxide window for use in an EEPROM memory cell so as to produce better programming endurance. This is achieved by providing a P+ implant at the tunnel window edge. As a result a voltage drop during the programming operation has been eliminated so as to provide enhanced performance.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. An EEPROM memory cell comprising:
    a PRJ region being implanted in a semiconductor substrate;
    a tunnel oxide layer being formed on the top surface of the PRJ region;
    a floating gate electrode being formed over the tunnel oxide on the top surface of the PRJ region;
    a first type of impurity ions being implanted into the PRJ region on a first side of the gate electrode with said gate electrode acting as a mask so as to form an N-type lightly-doped drain region;
    a second type of impurity ions being implanted into the PRJ region on a second side of the gate electrode with said gate electrode acting as a mask so as to form a P-type lightly-doped drain region;
    first and second sidewall spacers being formed on the respective first and second sides of the gate electrode;
    said first type of impurity ions being implanted into the PRJ region on the first side of the gate electrode with said gate electrode and said first sidewall spacer acting as a mask so as to form a highly-doped N+ diffusion region; and
    said second type of impurity ions being implanted into the PRJ region on the second side of the gate electrode with said gate electrode and said second sidewall spacer acting as a mask so as to form a highly-doped P+ contacted inversion layer.

2. A tunnel diode of a EEPROM memory cell, comprising:
    a PRJ (program junction) region formed in a semiconductor substrate;
    a tunnel layer formed on said PRJ region;
    a floating gate electrode formed over said tunnel layer;
    an N-type lightly doped region formed within said semiconductor substrate on a first side of said gate electrode with an N-type of impurity ions doping said N-type lightly doped region;
    a P-type lightly doped region formed within said semiconductor substrate on a second side of said gate electrode with a P-type of impurity ions doping said P-type lightly doped region;
    a highly-doped N+ diffusion region formed to the side of said N-type lightly doped region opposite to said gate electrode; and
    a highly-doped P+ contacted inversion layer formed to the side of said P-type lightly doped region opposite to said gate electrode.

3. The tunnel diode of claim 2, wherein said N-type lightly doped region is formed when said N-type of impurity ions are implanted into said N-type lightly doped region within said semiconductor substrate with said gate electrode acting as a mask.

4. The tunnel diode of claim 1, wherein said P-type lightly doped region is formed when said P-type of impurity ions are implanted into said P-type lightly doped region within said semiconductor substrate with said gate electrode acting as a mask.

5. The tunnel diode of claim 1, further comprising:
    sidewall spacers formed on said first and second sides of said gate electrode after formation of said N-type lightly doped region and said P-type lightly doped region;
    wherein said highly-doped N+ diffusion region is formed when an N-type of impurity ions are implanted into said highly-doped N+ diffusion region within said semiconductor substrate with said gate electrode and said sidewall spacer on said first side of said gate electrode acting as a mask;

and wherein said highly-doped P+ contacted inversion layer is formed when a P-type of impurity ions are implanted into said highly-doped P+ contacted inversion layer within said semiconductor substrate with said gate electrode and said sidewall spacer on said second side of said gate electrode acting as a mask.

6. The tunnel diode of claim 1, wherein said tunnel layer is comprised of silicon dioxide ($SiO_2$), wherein said floating gate electrode is comprised of polysilicon, and wherein said semiconductor substrate is comprised of silicon.

7. The tunnel diode of claim 1, wherein said floating gate electrode is coupled to a floating gate node of a sense transistor of said EEPROM memory cell, and wherein said highly-doped P+ contacted inversion layer is coupled to a source of a write transistor of said EEPROM memory cell.

8. An EEPROM memory cell comprising:

read transistors having drains coupled together to form an output of said EEPROM memory cell and having gates coupled together to form a floating gate node;

a write transistor; and a tunnel diode comprising:
  a PRJ (program junction) region formed in a semiconductor substrate;
  a tunnel layer formed on said PRJ region;
  a floating gate electrode formed over said tunnel layer;
  an N-type lightly doped region formed within said semiconductor substrate on a first side of said gate electrode with an N-type of impurity ions doping said N-type lightly doped region;
  a P-type lightly doped region formed within said semiconductor substrate on a second side of said gate electrode with a P-type of impurity ions doping said P-type lightly doped region;
  a highly-doped N+ diffusion region formed to the side of said N-type lightly doped region opposite to said gate electrode; and
  a highly-doped P+ contacted inversion layer formed to the side of said P-type lightly doped region opposite to said gate electrode;
  wherein said floating gate electrode of said tunnel diode is coupled to said floating gate node of said EEPROM memory cell, and wherein said highly-doped P+ contacted inversion layer of said tunnel diode is coupled to a source of said write transistor of said EEPROM memory cell.

9. The EEPROM memory cell of claim 8, wherein said N-type lightly doped region of said tunnel diode is formed when said N-type of impurity ions are implanted into said N-type lightly doped region within said semiconductor substrate with said gate electrode acting as a mask.

10. The EEPROM memory cell of claim 8, wherein said P-type lightly doped region of said tunnel diode is formed when said P-type of impurity ions are implanted into said P-type lightly doped region within said semiconductor substrate with said gate electrode acting as a mask.

11. The EEPROM memory cell of claim 8, wherein said tunnel diode further comprises:

sidewall spacers formed on said first and second sides of said gate electrode after formation of said N-type lightly doped region and said P-type lightly doped region;

wherein said highly-doped N+ diffusion region of said tunnel diode is formed when an N-type of impurity ions are implanted into said highly-doped N+ diffusion region within said semiconductor substrate with said gate electrode and said sidewall spacer on said first side of said gate electrode acting as a mask;

and wherein said highly-doped P+ contacted inversion layer of said tunnel diode is formed when a P-type of impurity ions are implanted into said highly-doped P+ contacted inversion layer within said semiconductor substrate with said gate electrode and said sidewall spacer on said second side of said gate electrode acting as a mask.

12. The EEPROM memory cell of claim 9, wherein said tunnel layer is comprised of silicon dioxide ($SiO_2$), wherein said floating gate electrode is comprised of polysilicon, and wherein said semiconductor substrate is comprised of silicon.

* * * * *

UNITED STATES PATENT AND TRADEMARK OFFICE
CERTIFICATE OF CORRECTION

PATENT NO.    : 6,545,313 B1                                                    Page 1 of 1
DATED         : April 8, 2003
INVENTOR(S)   : Jiang et al.

It is certified that error appears in the above-identified patent and that said Letters Patent is hereby corrected as shown below:

Column 6,
Lines 56 and 61, "claim 1," should be -- claim 2, --

Column 7,
Lines 11 and 15, "claim 1," should be -- claim 2, --

Column 8,
Line 35, "claim 9," should be -- claim 8, --

Signed and Sealed this

Twenty-third Day of September, 2003

JAMES E. ROGAN
*Director of the United States Patent and Trademark Office*